(12) United States Patent
Stockstad

(10) Patent No.: US 8,374,196 B2
(45) Date of Patent: Feb. 12, 2013

(54) METHODS AND APPARATUS FOR A SWITCHABLE BALUN FOR COMBINED BLUETOOTH® AND WLAN OPERATION

(75) Inventor: Troy Stockstad, Chandler, AZ (US)

(73) Assignee: QUALCOMM, Incorporated, San Diego, CA (US)

( * ) Notice: Subject to any disclaimer, the term of this patent is extended or adjusted under 35 U.S.C. 154(b) by 429 days.

(21) Appl. No.: 12/709,390

(22) Filed: Feb. 19, 2010

(65) Prior Publication Data

US 2011/0204990 A1    Aug. 25, 2011

(51) Int. Cl.
    *H04J 3/16* (2006.01)
(52) U.S. Cl. .................... 370/465; 330/276; 330/297
(58) Field of Classification Search .................. None
    See application file for complete search history.

(56) References Cited

U.S. PATENT DOCUMENTS

| | | | |
|---|---|---|---|
| 6,323,733 B1 | 11/2001 | Gorcea et al. | |
| 7,620,399 B2 * | 11/2009 | Kim et al. | 455/436 |
| 2007/0152510 A1 * | 7/2007 | Lin | 307/130 |
| 2007/0286306 A1 * | 12/2007 | Dahlfeld | 375/295 |
| 2008/0144707 A1 * | 6/2008 | Tsfati et al. | 375/224 |
| 2009/0117864 A1 | 5/2009 | Cassia et al. | |
| 2009/0153250 A1 | 6/2009 | Rofougaran | |
| 2010/0248660 A1 * | 9/2010 | Bavisi et al. | 455/120 |
| 2011/0171994 A1 * | 7/2011 | Rajendran et al. | 455/552.1 |
| 2011/0215880 A1 * | 9/2011 | Roufoogaran | 333/4 |

FOREIGN PATENT DOCUMENTS

JP    2002290247 A    10/2002

OTHER PUBLICATIONS

Dalmia S, et al., "Global Universal Radio Units (GURU) Realized Using Multilayer Organics (MLO)", IEEE Electronic Components and Technology Conference, 2007, May 1, 2007, pp. 979-985, XP031180617.
International Search Report and Written Opinion—PCT/US2011/024932—ISA/EPO—Jun. 1, 2011.

* cited by examiner

*Primary Examiner* — Donald Mills
(74) *Attorney, Agent, or Firm* — Ramin Mobarhan

(57) ABSTRACT

Methods and apparatus for a switchable balun for combined BLUETOOTH® and WLAN operation. A switchable balun is provided that includes an input circuit for receiving an amplified signal, the input circuit comprising first and second coils connected at a center tap, an output circuit comprising a third coil that is inductively coupled to the first and second coils, the output circuit for outputting an adjusted version of the amplified signal for transmission in a selected transmission mode, and a switch coupled to the center tap, wherein the switch is configured to couple a first voltage to the center tap to select operation in a first transmission mode and to couple a second voltage to the center tap to select operation in a second transmission mode.

15 Claims, 4 Drawing Sheets

METHODS AND APPARATUS FOR A SWITCHABLE BALUN FOR COMBINED BLUETOOTH® AND WLAN OPERATION

BACKGROUND

1. Field

The present application relates generally to the operation and design of a RF front end for use in portable devices, and more particularly, to methods and apparatus for a switchable balun for combined BLUETOOTH® and WLAN operation.

2. Background

Efficient signal transmission and reception is especially important in portable devices due to limits on circuitry size and power constraints. Typically, such devices include a power amplifier that is coupled to a balanced-to-unbalance (balun) transformer that is used to transform balanced signals from the power amplifier (PA) to unbalanced signals that are coupled to an antenna for transmission.

Advances in communication systems have resulted in the development of various types of wireless networks that may be accessed by a portable device. For example, a wireless local area network (WLAN) may be accessed by a portable device to allow communication with other devices over a localized area such as an office complex or a home. Alternatively, a BLUETOOTH® (BT) network may be accessed by a portable device to allow the device to control printers, hard drives or other types of devices over a relatively short distance. Thus, as a portable device moves from one region to another, one or more wireless networks may become accessible to the device.

Typically, a device includes dedicated circuitry to allow communications with a particular type of wireless network. Thus, devices offering support for both BT and WLAN networks include separate circuitry to accommodate the different power requirements. For example, devices that are operable to communicate over both BT and WLAN networks include multiple transmitter circuits each comprising a separate PA, balun, and support circuitry. Unfortunately, having multiple transmit circuits to support multiple network connections increases costs and circuit board space requirements.

Therefore, it would be desirable to have a transmitter circuit that can be optimally tuned to communicate with both BT and WLAN networks thereby reducing the component count, costs, and/or circuit size when compared to conventional circuits.

BRIEF DESCRIPTION OF THE DRAWINGS

The foregoing aspects described herein will become more readily apparent by reference to the following Description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
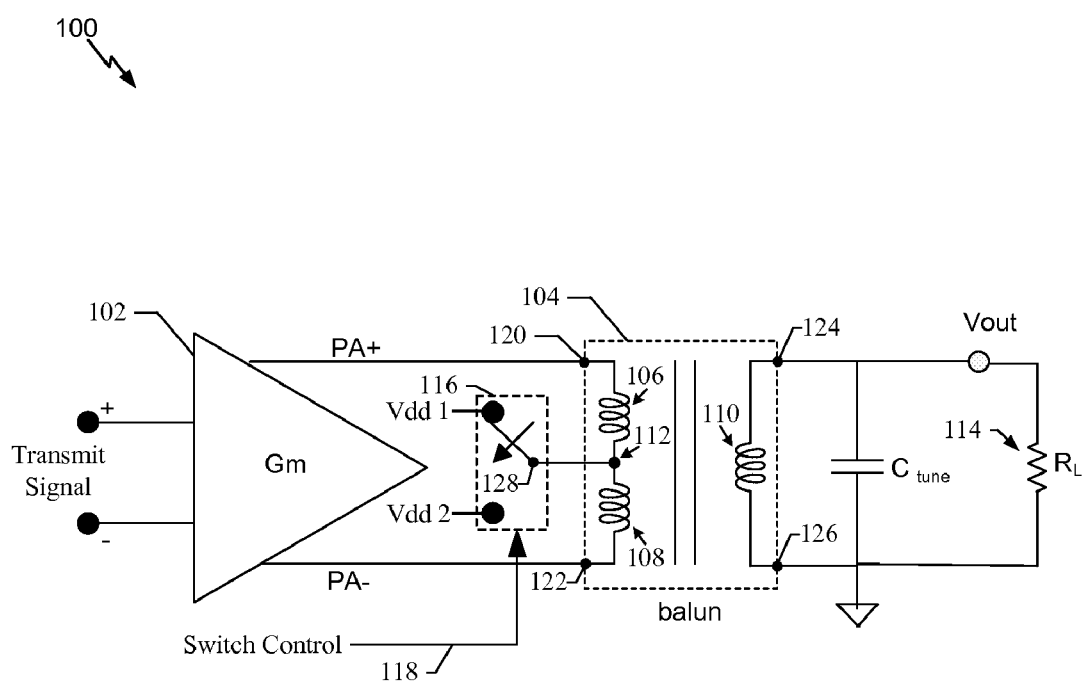
FIG. 1 shows an exemplary switchable balun constructed in accordance with exemplary embodiments of the invention.

The disclosed system provides a novel balun system that allows a single radio frequency (RF) front end (FE) to provide WLAN and BT functionality thereby providing a low cost solution to service both protocols. The system comprises a switchable balun that operates to adjust transmission levels of a transmit signal thereby allowing one PA to operate in accordance with both WiFi and BLUETOOTH® transmission protocols FIG. 1 shows an exemplary front end 100 comprising a switchable balun constructed in accordance with exemplary embodiments of the invention. The front end 100 comprises amplifier 102 that receives a balanced transmit signal for transmission to either a BT or WLAN network. The balanced output of the amplifier (PA+, PA−) is input to input nodes 120 and 122 of a switchable balun 104.

The switchable balun 104 comprises an input circuit coupled to the input nodes 120 and 122 and includes a first coil portion 106 coupled to a second portion 108 at center tap 112. The switchable balun 104 also comprises an output circuit having a third coil portion 110 that is coupled through output nodes 124 and 126 to a transmission load shown as resistive load ($R_L$) 114. The switchable balun 104 operates as a transformer wherein the output circuit is inductively coupled to the input circuit. For example, the input circuit (i.e., differential input) comprising the first 106 and second 108 coil portions may have an inductance value in the range of 1.0 nanohenry (nH). The output circuit (i.e., single ended output) comprising the third coil portion 110 may also have an inductance value in the range of 1.0 nH. Thus, such a balun would operate as a 1:1 transformer. It should be noted that other inductance values and other transformation ratios could be utilized. In one implementation, the size of the inductance values is dependent on the size of the inductors on the die and the associated technology.

The center tap 112 is coupled to a center pole 128 of a switch 116 comprising two other poles. A first pole is coupled to a first voltage (Vdd1) and a second pole is coupled to a second voltage (Vdd2). Generally Vdd1 is greater than Vdd2. In one implementation, the first voltage (Vdd1) is approximately 2.9 volts and the second voltage (Vdd2) is approximately 1.3 volts. The operation of the switch 116 is control by a switch control signal 118 that is generated by other circuitry of the front end not shown. For example, a device may select the desired network operation based on user input and generate the switch control signal 118 accordingly.

During operation of the balun system, the switch control signal 118 controls the switch 116 to couple the center tap 112 to Vdd1 for WLAN operation and to Vdd2 for BT operation. For example, adjusting the voltage level of the center tap 112 results in scaling the input signal that is inductively coupled to the output circuit of the switchable balun 104. The result is that the transmit signal is transmitted at levels appropriate for the selected network communication. The single PA with the switchable balun 104 can then support the higher output power and linearity requirements of WLAN with a connection to Vdd1, while also supporting the lower output power and peak-to-average power ratio (PAR) requirements of BT operation at a lower supply voltage Vdd2 with lower power dissipation.

Therefore, the front end 100 can be used for both WLAN and BT operation, thereby saving circuit board space and the cost of additional circuitry that would be required to provide two transmitter circuits as in conventional systems.

Figure 2:
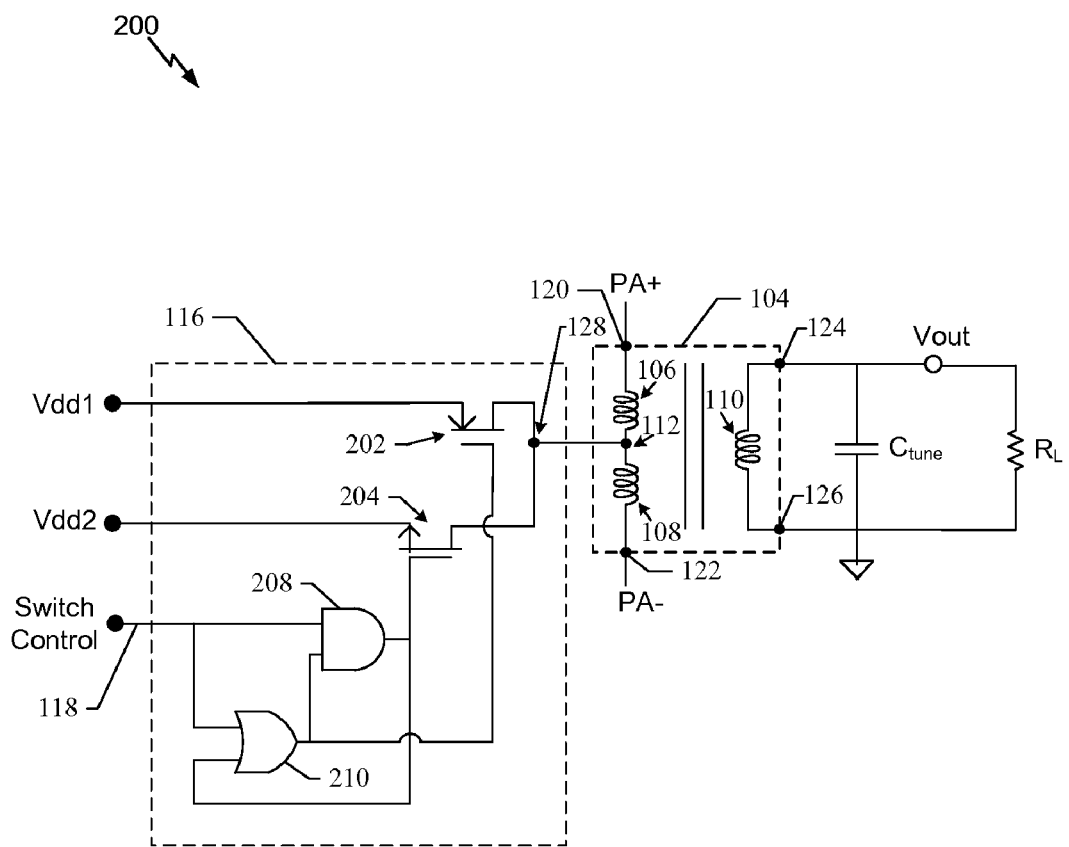
FIG. 2 shows a detailed view of the switchable balun illustrated in FIG. 1.

FIG. 2 shows a detailed view 200 illustrating portions of the front end 100 shown in FIG. 1. For example, the detailed view 200 comprises the switch 116 and the switchable balun 104.

The switch 106 comprises AND gate 202 and OR gate 204 that are coupled to receive the switch control signal 118. The gates 202 and 204 are also coupled to transistors 206 and 208. Transistor 206 is coupled to receive Vdd1 and transistor 208 is coupled to receive Vdd2. When the transistors 206 or 208 are activated, they operate to couple their corresponding voltage to the center tap 112 of the switchable balun 104.

During operation, the switch control signal 118 operates to determine which of the voltages (Vdd1 or Vdd2) is coupled to the center tap 112. For example, when the switch control signal 118 is set to a first state (i.e., logical 0 or low state), then the output of gates 208 and 210 are also set to the logical 0 or low state which activates transistor 202 and deactivates transistor 204. As a result, the transistor 202 couples the voltage Vdd1 to the center tap 112. Conversely, when the switch control signal 118 is set to a second state (i.e., logical 1 or high state), then the output of gates 208 and 210 are also set to the logical 1 or high state which activates transistor 204 and deactivates transistor 202. As a result, the transistor 204 couples the voltage Vdd2 to the center tap 112. The logical operation of gates 208 and 210 is such that both transistors 206 and 208 are not active at the same time, thus preventing a state where Vdd1 is shorted to Vdd2.

The voltage that is coupled to the center tap 112 operates to scale the signal that is inductively coupled to the output circuit of the switchable balun 104. The result is that the transmit signal is transmitted at levels appropriate for the selected network communication. For example, when Vdd1 is coupled to the center tap 112 the signal transmission is appropriately scaled for transmission according to the WLAN protocol. Alternatively, when Vdd2 is coupled to the center tap 112 the signal transmission is appropriately scaled for transmission according to the BT protocol.

Figure 3:
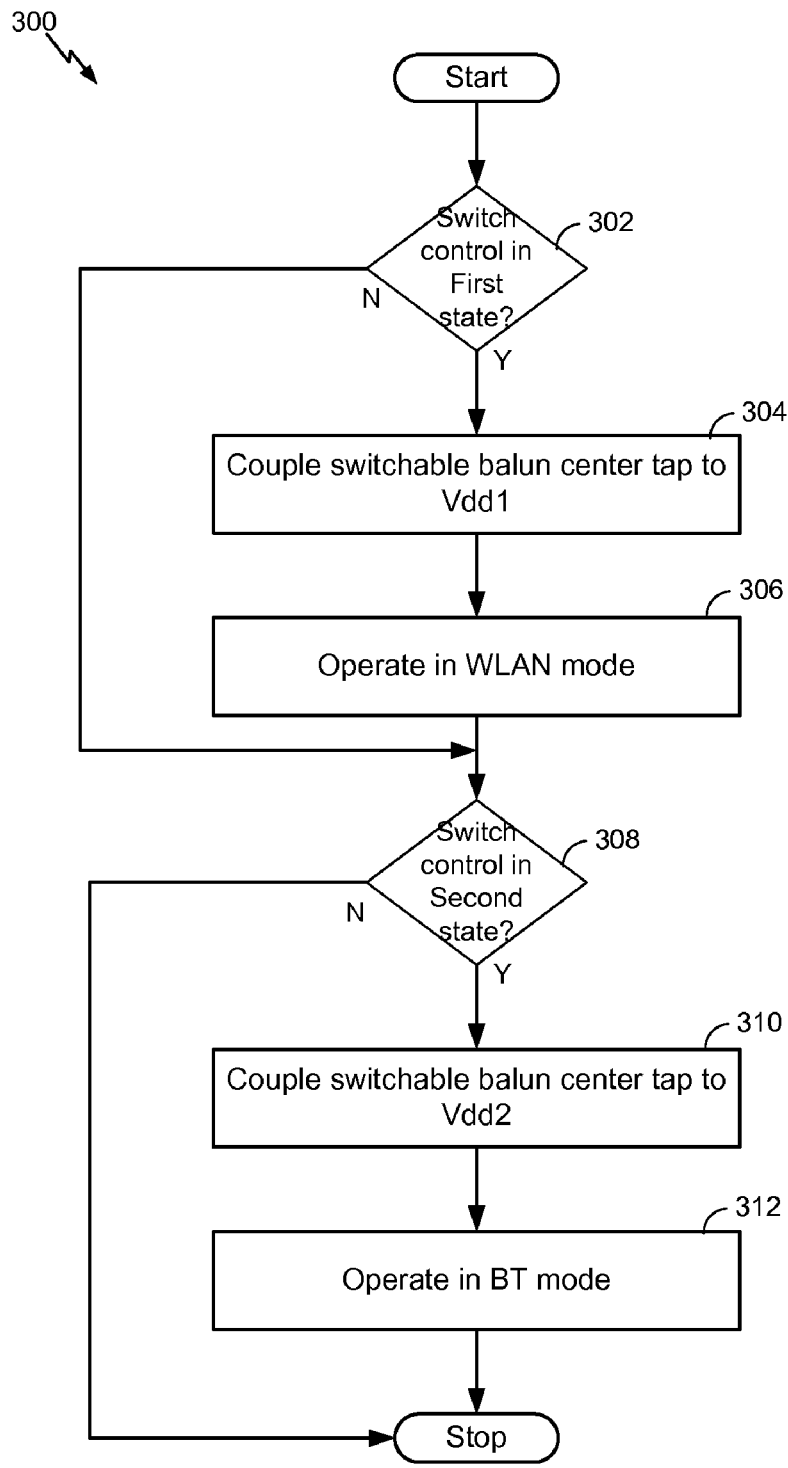
FIG. 3 shows an exemplary method for operating a switchable balun in accordance with exemplary embodiments of the invention.

FIG. 3 shows an exemplary method 300 for operating a switchable balun in accordance with exemplary embodiments of the invention. For example, the method 300 is suitable for use with the switch 116 and the switchable balun 104 shown in FIG. 2.

At block 302, a determination is made as to whether the switch control signal 118 is in a first state indicating that WLAN operation is selected. In one implementation, the gates 208 and 210 process the switch control signal 118 to make this determination. If the switch control signal 118 is in the low state (i.e., logical 0), then the method proceeds to block 304. If the switch control signal 118 is not in the first state, then the method proceeds to block 308.

At block 304, the center tap of the switchable balun is coupled to Vdd1. In one implementation the transistor 202 is activated and couples the voltage Vdd1 to the center tap 112.

At block 306, operation in WLAN mode is enabled. For example, with the center tap 112 coupled to Vdd1 the switchable balun 104 operates to scale its input signal provided at nodes 122 and 124 so that when the input signal is inductively coupled to the output circuit the levels are appropriate for WLAN network communications.

At block 308, a determination is made as to whether the switch control signal 118 is in a second state indicating that BT operation is selected. In one implementation, the gates 208 and 210 process the switch control signal 118 to make this determination. If the switch control signal 118 is in the high state (i.e., logical 1), then the method proceeds to block 310. If the switch control signal 118 is not in the second state, then the method ends.

At block 310, the center tap of the switchable balun is coupled to Vdd1. In one implementation the transistor 204 is activated and couples the voltage Vdd2 to the center tap 112.

At block 312, operation in BT mode is enabled. For example, with the center tap 112 coupled to Vdd2 the switchable balun 104 operates to scale its input signal provided at nodes 122 and 124 so that when the input signal is inductively coupled to the output circuit the levels are appropriate for BT network communications.

Therefore, the method 300 illustrates a method of operating a switchable balun in accordance with exemplary embodiments of the invention. It should be noted that the method 300 is just one implementation and that the operations of the method 400 may be rearranged or otherwise modified within the scope of the various implementations. Thus, other implementations are possible.

Figure 4:
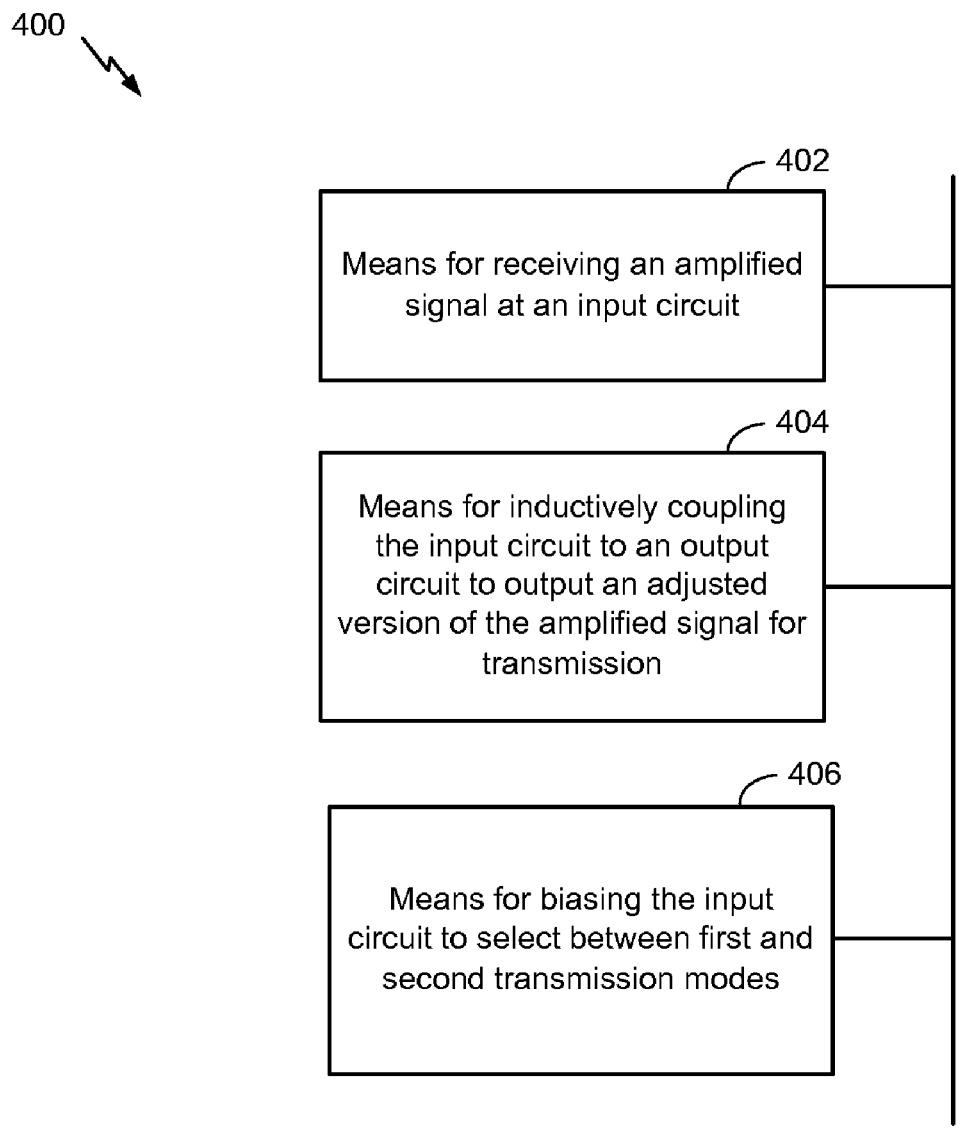
FIG. 4 shows an exemplary switchable balun constructed in accordance with exemplary embodiments of the invention.

FIG. 4 shows an exemplary switchable balun 400 constructed in accordance with exemplary embodiments of the invention. For example, the switchable balun 400 is implemented by at least one integrated circuit comprising one or more modules as described herein. For example, in one implementation, each module comprises hardware and/or hardware executing software.

The switchable balun 400 comprises a first module comprising means (402) for receiving an amplified signal at an input circuit, which in one implementation comprises the input nodes 120 and 122. The switchable balun 400 also comprises a second module comprising means (404) for inductively coupling the input circuit to an output circuit to output an adjusted version of the amplified signal for transmission, which in one implementation comprises the switchable balun 104. The switchable balun 400 also comprises a third module comprising means (406) for biasing the input circuit to select between first and second transmission modes, which in one implementation comprises the switch 116.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A switchable balun for use in a radio frequency (RF) front end to provide multiple transmission modes, the balun comprising:
an input circuit for receiving an amplified signal, the input circuit comprising first and second coils connected at a center tap;
an output circuit comprising a third coil that is inductively coupled to the first and second coils, the output circuit for outputting an adjusted version of the amplified signal for transmission in a selected transmission mode; and
a switch coupled to the center tap, wherein the switch is configured to couple a first voltage to the center tap to select operation in a first transmission mode and to couple a second voltage to the center tap to select operation in a second transmission mode.

2. The balun of claim 1, wherein said switch comprises a center pole coupled to the center tap, a first pole coupled to the first voltage and a second pole coupled to the second voltage.

3. The balun of claim 2, wherein said switch is coupled to receive a control signal having a first state that causes the switch to couple the center pole to the first voltage and a second state that causes the switch to coupled the center pole to the second voltage.

4. The balun of claim 1, wherein the first voltage is approximately 2.9 volts and the second voltage is approximately 1.3 volts.

5. The balun of claim 1, wherein the first transmission mode is a WLAN transmission mode and the second transmission mode is a BLUETOOTH® transmission mode.

6. A switchable balun for use in a radio frequency (RF) front end to provide multiple transmission modes, the balun comprising:
means for receiving an amplified signal at an input circuit;
means for inductively coupling the input circuit to an output circuit to output an adjusted version of the amplified signal for transmission; and
means for biasing the input circuit to select between first and second transmission modes.

7. The balun of claim 6, when said means for biasing comprises:
means for coupling a center tap of the input circuit to a first voltage to select a first transmission mode and for coupling the center tap of the input circuit to a second voltage to select a second transmission mode.

8. The balun of claim 7, wherein said means for coupling comprises means for receiving a control signal that controls said means for coupling to select one of the first and second transmission modes.

9. The balun of claim 7, wherein the first voltage is approximately 2.9 volts and the second voltage is approximately 1.3 volts.

10. The balun of claim 6, wherein the first transmission mode is a WLAN transmission mode and the second transmission mode is a BLUETOOTH® transmission mode.

11. A computer program product for use in a radio frequency (RF) front end to provide multiple transmission modes, the computer program product comprising:
a non-transitory computer-readable medium embodying codes executable by a processor to:
receive an amplified signal at an input circuit comprising first and second coils connected at a center tap;
output an adjusted version of the amplified signal from an output circuit that is inductively coupled to the first and second coils; and
couple the center tap to a first voltage to select operation in a first transmission mode and to a second voltage to select operation in a second transmission mode.

12. The computer-readable medium of claim 11, wherein said codes are configured to cause the processor to couple the center tap to the first and second voltages based on a control signal.

13. The computer-readable medium of claim 12, wherein said codes are configured to cause the processor to couple the center tap to the first voltage based on a first state of the control signal to select the first transmission mode, and to couple the center tap to the second voltage based on a second state of the control signal to select the second transmission mode.

14. The computer-readable medium of claim 11, wherein the first voltage is approximately 2.9 volts and the second voltage is approximately 1.3 volts.

15. The computer-readable medium of claim 11, wherein the first transmission mode is a WLAN transmission mode and the second transmission mode is a BLUETOOTH® transmission mode.

* * * * *